(12) United States Patent
Finger

(10) Patent No.: US 6,380,716 B1
(45) Date of Patent: Apr. 30, 2002

(54) CONDITION MONITORING OF OPPORTUNITY CHARGED BATTERIES

(75) Inventor: Eugene P. Finger, Brewster, NY (US)

(73) Assignee: Curtis Instruments, Inc., Mt. Kisco, NY (US)

( * ) Notice: Subject to any disclaimer, the term of this patent is extended or adjusted under 35 U.S.C. 154(b) by 0 days.

(21) Appl. No.: 09/716,121

(22) Filed: Nov. 17, 2000

(51) Int. Cl.[7] .................................................. H02J 7/00
(52) U.S. Cl. ........................................ 320/131; 320/130
(58) Field of Search ................................. 320/131, 130, 320/136, DIG. 21; 324/433, 426

(56) References Cited

U.S. PATENT DOCUMENTS 4,929,931 A * 5/1990 McCuen ..................... 320/161
5,451,881 A * 9/1995 Finger ........................ 320/136

* cited by examiner

*Primary Examiner*—Peter S. Wong
*Assistant Examiner*—Lawrence Luk
(74) *Attorney, Agent, or Firm*—John H. Crozier

(57) ABSTRACT

In a preferred embodiment, a method of condition monitoring of an opportunity charged battery, including: determining length of time the battery has been off-line; determining whether charging of the battery has occurred during the length of time; if step (b) results in a determination that the charging of the battery has occurred, determining degree of charging of the battery occurring during the length of time; and if step (b) results in a determination that charging of the battery has occurred, resetting a condition monitor associated with the battery to reflect the degree of charging of the battery.

14 Claims, 10 Drawing Sheets

CONDITION MONITORING OF OPPORTUNITY CHARGED BATTERIES

BACKGROUND OF THE INVENTION

1. Field of the Invention

The present invention relates to condition monitoring of batteries generally and, more particularly, but not by way of limitation, to novel condition monitoring of opportunity charged batteries in which the battery condition monitor is disconnected from the battery during charging.

2. Background Art

Conventionally, batteries for battery-powered vehicles have been given relatively long charging periods at regular intervals. A prime example of the type of vehicle with which this procedure is used is the battery-powered forklift truck which may be used for a working shift and then taken "off-line" for a shift while the battery is charged or the discharged battery on the forklift truck is replaced with a fully charged battery. This is generally the optimum charging arrangement for the battery. Additionally, ideally, but practically usually separated from the battery, a battery condition monitor, or "fuel gage" remains attached to the battery so that it continues to monitor the condition of the battery while charging is taking place.

Recently, there has been a proliferation of small battery-powered vehicles such as small battery-powered pallet trucks, lifts, and hand carts in such varied applications as grocery stores and lumber yards. Often, these replace manually operated vehicles, in order to provide a more "worker friendly" environment or to comply with laws regulating how much a worker can be required to lift. Because the use of such vehicles is less structured than the use of larger battery-powered vehicles, it is common to employ "opportunity charging" in which the battery is connected to a (usually) off-board charger, in a relatively time-unrelated manner, whenever the vehicle happens not to be in use for a period of time. In addition, the battery should periodically be fully charged. The battery is dedicated to a given vehicle and remains in place in the vehicle during charging, with the battery cable being disconnected from the vehicle and connected to the charger, thus removing power from the battery condition monitor and, consequently, presenting the monitor with a period in which it cannot monitor the condition of the battery.

There are several reasons a battery condition monitor may be disconnected: (1) merely for safety, with no charging or discharging, (2) to take advantage of an opportunity charge, (3) to put the battery on full charge as opposed to opportunity charging, (4) unintended system electrical intermittents or circuit breaker/fuse interruptions, (5) tampering or sabotage to "fool" the instrumentation so that the monitor indicates more or less than actual battery capacity, and/or (6) cost considerations precluding the addition of the necessary wiring and interconnections to keep the battery condition monitor operationally connected to the battery at all times. In any case, the monitor (if not manually reset after a full charge) must determine what happened to the battery during the period of disconnect.

Opportunity charging has been adequately addressed in numerous applications where a battery state-of-charge monitor is continuously connected to the battery. Some patents which generally describe such systems include: U.S. Pat. No. 4,012,681, issued Mar. 15, 1977, and titled BATTERY CONTROL SYSTEM FOR BATTERY OPERATED VEHICLES; U.S. Pat. No. 4,288,734, issued Sep. 8, 1981, and titled BIDIRECTIONAL INTEGRATOR; and U.S. Pat. No. 4,740,754, issued Apr. 26, 1988, titled BIDIRECTIONAL BATTERY STATE-OF-CHARGE MONITOR".

Some other patents which describe such systems and which require relatively precise relaxation characterization and very high accuracy and resolution in measurement include: U.S. Pat. No. 4,388,618, issued Jun. 14, 1983, and titled BATTERY STATE OF CHARGE INDICATOR OPERATING ON BIDIRECTIONAL INTEGRATIONS OF TERMINAL VOLTAGE; U.S. Pat. No. 4,460,870, issued Jul. 17, 1984, and titled QUIESCENT VOLTAGE SAMPLING BATTERY STATE OF CHARGE METER; and U.S. Pat. No. 4,514,694, issued Apr. 30, 1985, and titled QUIESCENT BATTERY TESTING METHOD AND APPARATUS.

Some additional patents which describe battery state of charge monitoring systems include U.S. Pat. No. 4,017,724, issued Apr. 12, 1977, and titled APPARATUS FOR MEASURING BATTERY DEPLETION BY MONITORING REDUCTIONS IN VOLTAGE; U.S. Pat. No. 4,193,026, issued Mar. 11, 1980, and titled METHOD AND APPARATUS FOR MEASURING THE STATE OF CHARGE OF A BATTERY BY MONITORING REDUCTIONS IN VOLTAGE; U.S. Pat. No. 4,560,937, issued Dec. 24, 1985, and titled BATTERY STATE OF CHARGE METERING METHOD AND APPARATUS; and U.S. Pat. No. 5,451,881, issued Sep. 19, 1995, and titled METHOD AND MEANS FOR ADJUSTING BATTERY MONITOR BASED ON RATE OF CURRENT DRAWN FROM THE BATTERY.

The disclosures of the foregoing patents are incorporated by reference hereinto.

Accordingly, it is a principal object of the present invention to provide a method of monitoring battery condition in situations in which the battery condition monitor may be disconnected from the battery for a period of time, the method including computing battery charge restoration through implication whenever the battery has been disconnected from the battery condition monitor.

A further object of the present invention is to provide such a method which employs a knowledge set including: (1) an approximate characterization of the battery's relaxation response, (2) an approximate characterization of the charging response of the battery and battery charger combination, (3) knowledge of the battery's computed state-of-charge at the moment of disconnection of the monitor from the battery, (4) knowledge of the real time at the moment of disconnection of the monitor from the battery, (5) knowledge of the real time at the moment of reconnection of the monitor to the battery, and/or (6) knowledge of the battery's voltage at the moment of reconnection of the monitor to the battery.

An additional object of the present invention is to provide such a method that provides an estimate of the length of disconnection time during which the battery was charged.

Other objects of the present invention, as well as particular features, elements, and advantages thereof, will be elucidated in, or be apparent from, the following description and the accompanying drawing figures.

SUMMARY OF THE INVENTION

The present invention achieves the above objects, among others, by providing, in a preferred embodiment, a method of condition monitoring of an opportunity charged battery, comprising: (a) determining length of time said battery has been off-line; (b) determining whether charging of said battery has occurred during said length of time; (c) if step (b)

results in a determination that said charging of said battery has occurred, determining degree of charging of said battery occurring during said length of time; and (d) if step (b) results in a determination that charging of said battery has occurred, resetting a condition monitor associated with said battery to reflect said degree of charging of said battery.

BRIEF DESCRIPTION OF THE DRAWING

Understanding of the present invention and the various aspects thereof will be facilitated by reference to the accompanying drawing figures, submitted for purposes of illustration only and not intended to define the scope of the invention, on which.

DETAILED DESCRIPTION OF THE PREFERRED EMBODIMENTS

Figure 1:
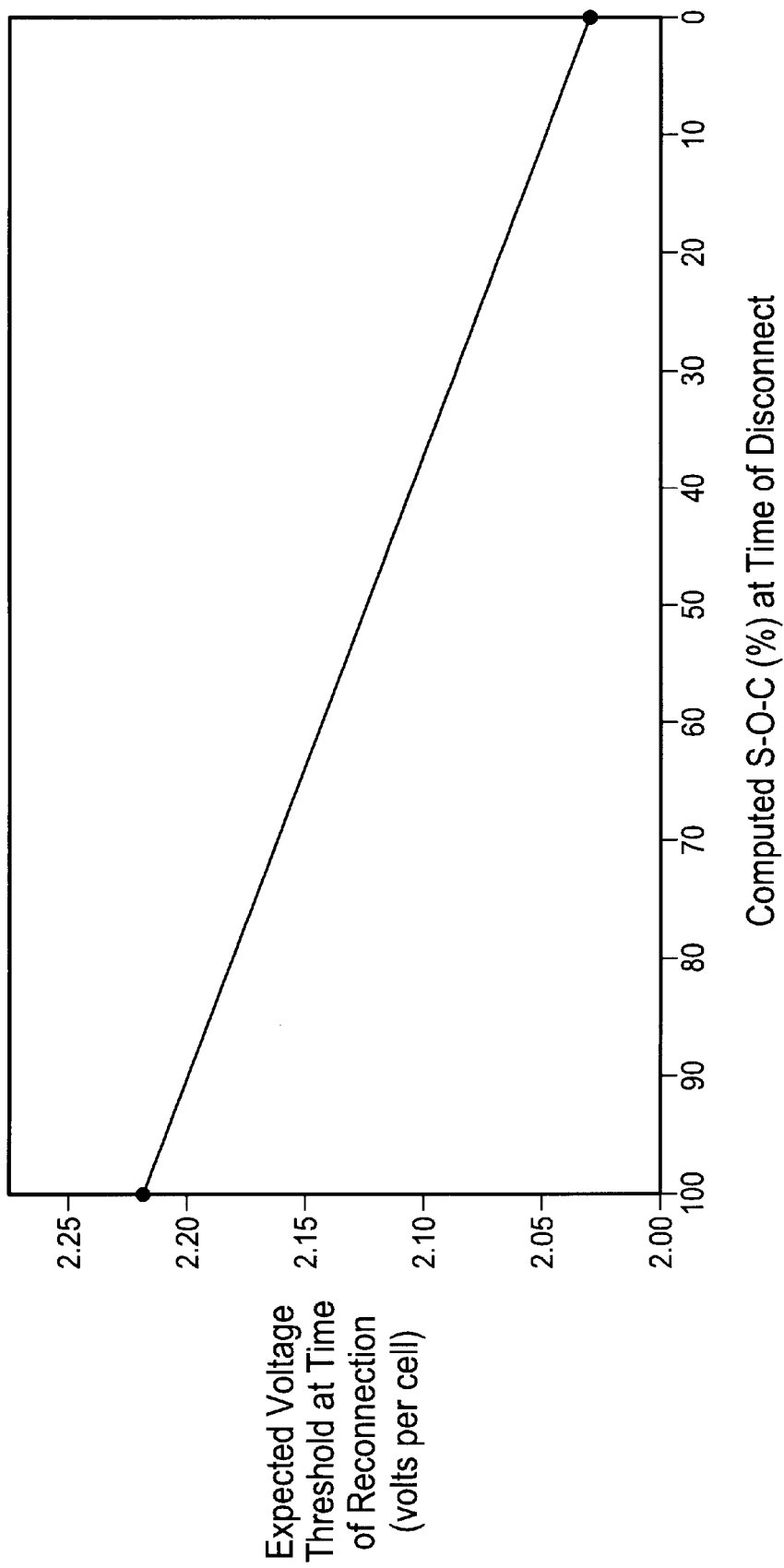
FIG. 1 is a graph of expected voltage threshold at time of reconnection of a battery versus computed state-of-charge at time of disconnection of the battery, from the system of the present invention.

Whenever herein measurement of voltage is used in determining the length of time a battery has been disconnected, it will be understood that measurement of the specific gravity of the electrolyte of the battery may be used in determining the length of time the battery has been disconnected, whenever there is a specific gravity sensor on board the battery.

Of primary importance in any of the embodiments described below is the determination of the time the battery under consideration has been off-line and during which time the battery may or may not have been recharged to some degree. The method of determining the time is not critical to the practicing of the present invention, but a number of methods are possible. One method that may be employed to determine this time is to have an external battery back-up time of day and date clock connected to the monitoring instrument to input the elapsed time or to provide data to permit the monitoring instrument to compute the elapsed time. Another method is to provide a battery back-up micropower clock within, or associated with, the monitoring instrument. An additional method is to provide a battery back-up micropower oscillator and counter within, or associated with, the monitoring instrument. A further method is to provide a capacitor or super capacitor back-up rather than a battery for the immediately preceding two methods. Yet another method is to provide a capacitor or super capacitor within, or associated with, the monitoring instrument where the state-of-charge of the capacitor or super capacitor is indicative of the length of disconnect time.

In the simplest embodiment of the present invention, the monitoring instrument determines the disconnect time upon reconnection to the battery, using one of the methods described above or another suitable method. The battery terminal voltage is measured at time of reconnection and a determination is made as to whether the voltage is higher or lower than a fixed, predetermined value which experience with the system under consideration indicates that charging had occurred, the charging having occurred substantially all during the disconnect time in terms of, for example, minutes or percentage of time. The predetermined value may be obtained from a look-up table in the monitoring instrument and it should be some unambiguous number; that is, terminal voltage above or below the number should unambiguously indicate, respectively, whether or not the battery had or had not been recharged during the disconnect time.

If the terminal voltage is lower than the number, the monitoring instrument will assume that recharging had not occurred and the status computation will remain as is. If the terminal voltage is higher than the number, the monitoring instrument will drive the computed state-of-charge higher by an amount equal to the product of the disconnect time, times a factor if necessary, and a fixed percent charge restoration per hour as determined by experience with the particular battery and charger combination. For example, if on average 15 percent of battery capacity were restored per hour during recharging and the disconnect time were 20 minutes, the state-of-charge computation would be driven up five percent to a maximum of "full". For another example, if with the same battery/charger combination, the disconnect time were two hours, the state-of-charge computation would be driven up 30 percent to a maximum of "full".

This method, of course, assumes that battery restoration is constant; that is, a constant rate of coulombs per hour is added to the battery, regardless of the state of charge of the battery.

A first refinement to the basic embodiment described above is to provide an expected battery threshold voltage upon reconnection, the expected battery threshold voltage being a function of the previously computed state-of-charge at battery disconnection. For higher computed states-of-charge, higher threshold voltages would be expected for determining whether charging had occurred. This is illustrated on FIG. 1. Here, rather than using the fixed predetermined value of the basic embodiment described above, the computed state-of-charge of the battery at time of disconnection is used to provide an expected voltage threshold at time of reconnection. If the actual terminal voltage at time of reconnection is greater than the expected voltage threshold from FIG. 1, it is assumed that charging of the battery has occurred and the battery monitor is reset accordingly. If the actual voltage threshold is the same as or slightly less than the expected voltage threshold, it is assumed that no charging has taken place and no adjustment is made to the battery monitor.

Figure 2:
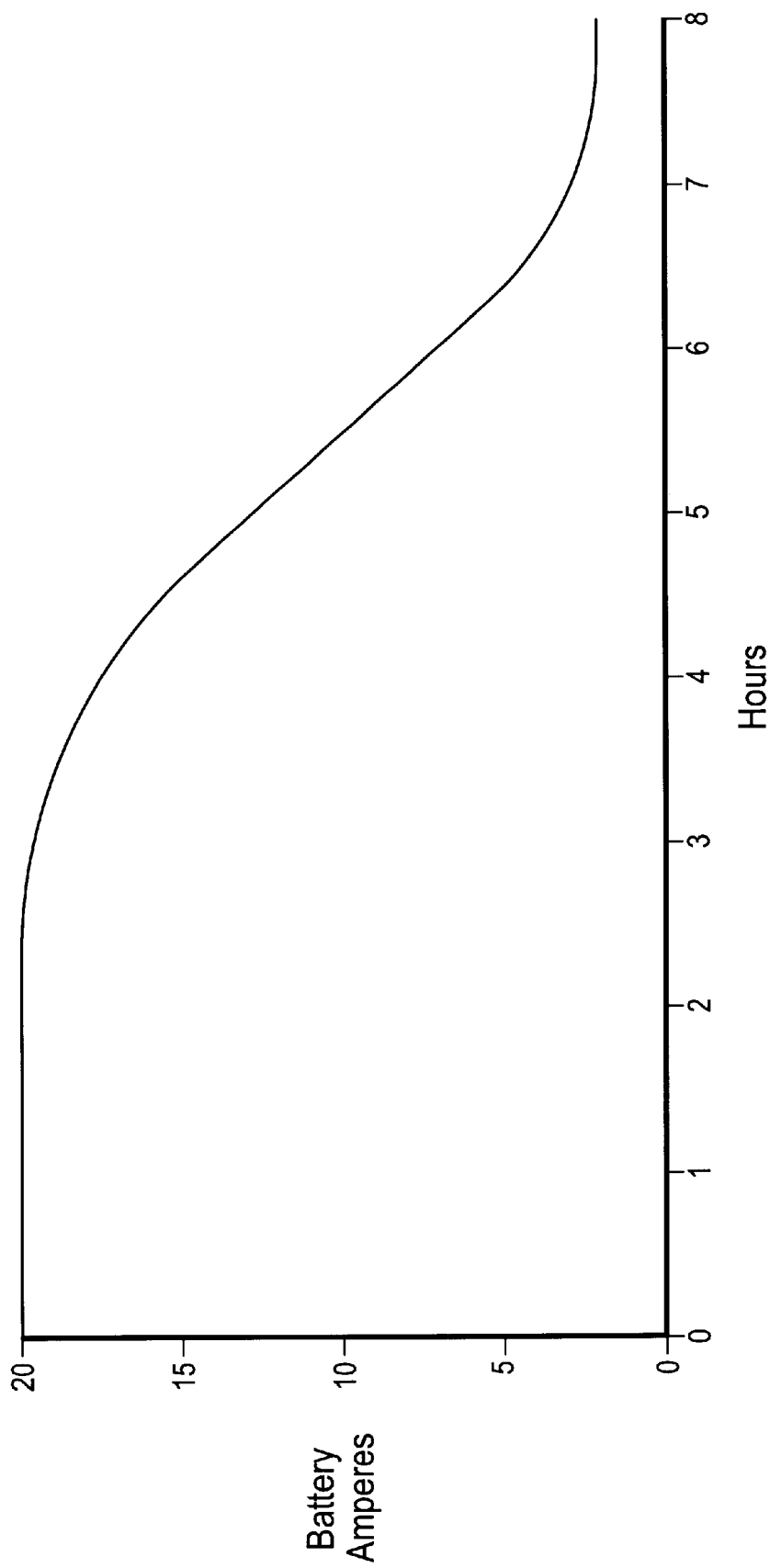
FIG. 2 is a graph of charging amperes versus time for an exemplary battery.
Figure 3:
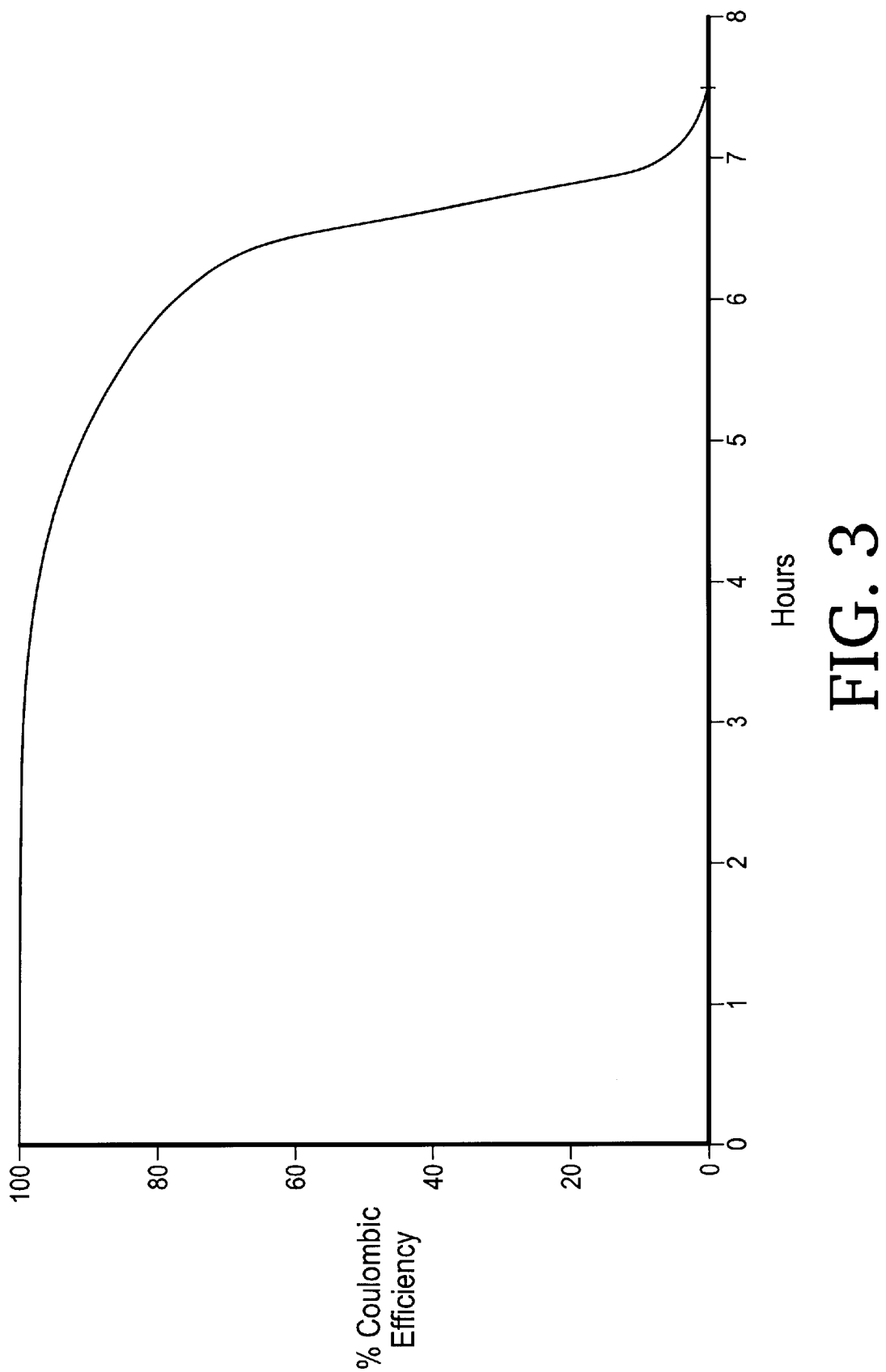
FIG. 3 is a graph of coulombic efficiency versus time for the charging of the battery of FIG. 2.

A second refinement to the basic embodiment introduces a charge restoration transform which closely matches the battery plus charger combination in terms of rate of charge restoration as a function of computed state-of-charge. This transform is fairly sophisticated in that it takes into account two elements of "true" charge restoration. First, it accounts for the instantaneous charge rate, or current. Second, it accounts for the effectiveness, or coulombic efficiency, of that current at varying states-of-charge. FIGS. 2 and 3 illustrate, respectively, charging current versus time and coulombic efficiency versus time for an exemplary battery.

Figure 4:
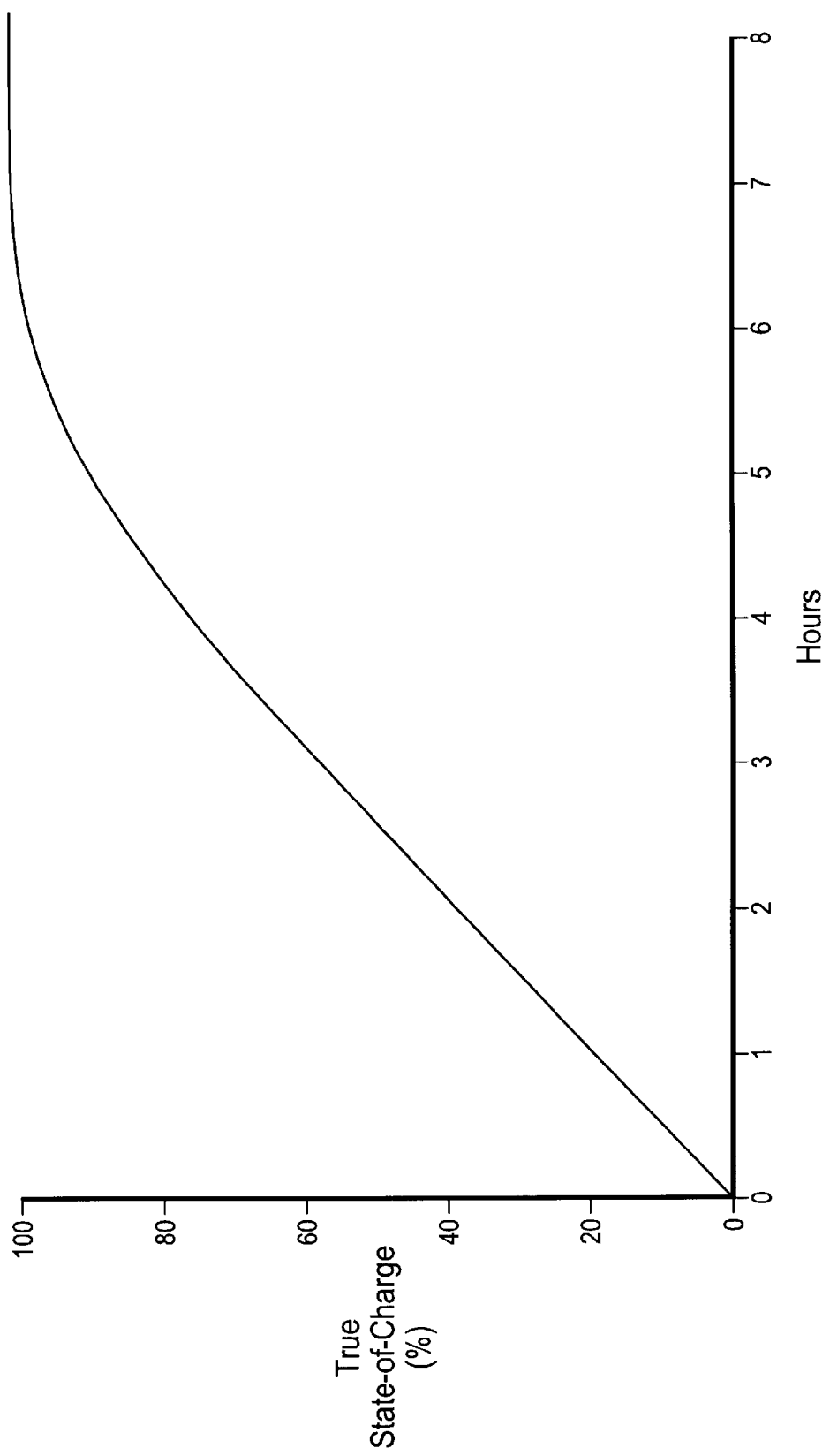
FIG. 4 is a graph of true state-of-charge versus time, developed from the data of FIGS. 2 and 3.

The data presented on FIGS. 2 and 3 are combined, using experimental data developed for the exemplary battery, into a single transform, illustrated on FIG. 4, in terms of true state-of charge versus time and the computed state-of-charge at the time of disconnection, which establishes the maximum charge that can be restored during any disconnect interval. This transform, then, is employed to reset the computed state-of-charge in the battery monitor.

The charge restoration transform illustrated on FIG. 4 can be created in a number of forms, i.e., look-up tables or equations, for example. An example of a 256-byte look-up table based on the transform illustrated on FIG. 4 is shown in Table I. The table is approximate and truncated; however, such a table may be developed to any desired degree of resolution. In the table, the true state-of-charge is divided into 256 increments, each representing 1/256 (or approximately 0.4 percent) of capacity. Each of these state-of-charge values has a corresponding elapsed disconnect time value which can be expressed in any convenient unit of time including arbitrary "machine time". The example uses a minute as a unit of time; therefore, all values of time will fall between 0 and 480 minutes. The table may be entered using either state-of-charge or elapsed time.

TABLE I

| State of Charge | T1 |
| --- | --- |
| 1/256 | 1.20 |
| 1/128 | 2.57 |
| 3/256 | 3.73 |
| 1/64 | 4.90 |
| 5/256 | 6.10 |
| . | . |
| . | . |
| . | . |
| 125/256 | 164.1 |
| 63/128 | 165.4 |
| 127/256 | 166.7 |
| 1/2 | 168.0 |
| 129/256 | 169.3 |
| 65/128 | 170.6 |
| 131/256 | 171.9 |
| . | . |
| . | . |
| . | . |
| 229/256 | 296.0 |
| 115/128 | 298.0 |
| 231/256 | 300.0 |
| 29/32 | 302.0 |
| 233/256 | 304.0 |
| . | . |
| . | . |
| . | . |
| 127/128 | 420.0 |
| 255/256 | 450.0 |
| 1/1 | 480.0 |

The following procedure may be employed to use the data presented in Table I.

(1) The computed state-of-charge is entered in memory at the time of disconnect.
(2) The fact that charging has occurred is ascertained at the next reconnection.
(3) The elapsed time (TE) of disconnection is computed using one of the methods described above.
(4) The stored state-of-charge is taken from memory and presented to the look-up routine and a time (T1) is extracted from the table.
(5) TE is added to T1 to create T2 (T2=T1+TE).
(6) The look-up table is reentered using T2 as the point of entry and the corresponding value for state-of-charge is extracted from the table.
(7) The extracted value for state-of-charge is then used to update (increment upwards) the state-of-charge computation. Round-off rules and resolution are arbitrary and are simple matters of judgement depending on desired accuracy and cost tradeoffs.

Examples of the above procedure are presented in Table II.

TABLE II

| Step | EXAMPLE I | EXAMPLE II |
| --- | --- | --- |
| (1) | 1% | 49% |
| (2) | Yes | Yes |
| (3) | 302 Min. | 132 Min. |
| (4) | 2.5 Min. | 164.1 Min. |
| (5) | 304.4 Min. | 296.1 Min. |
| (6) | 233/256 | 229/256 |
| (7) | 91%* | 89%* |

*final updated computed state-of-charge.

Figure 5:
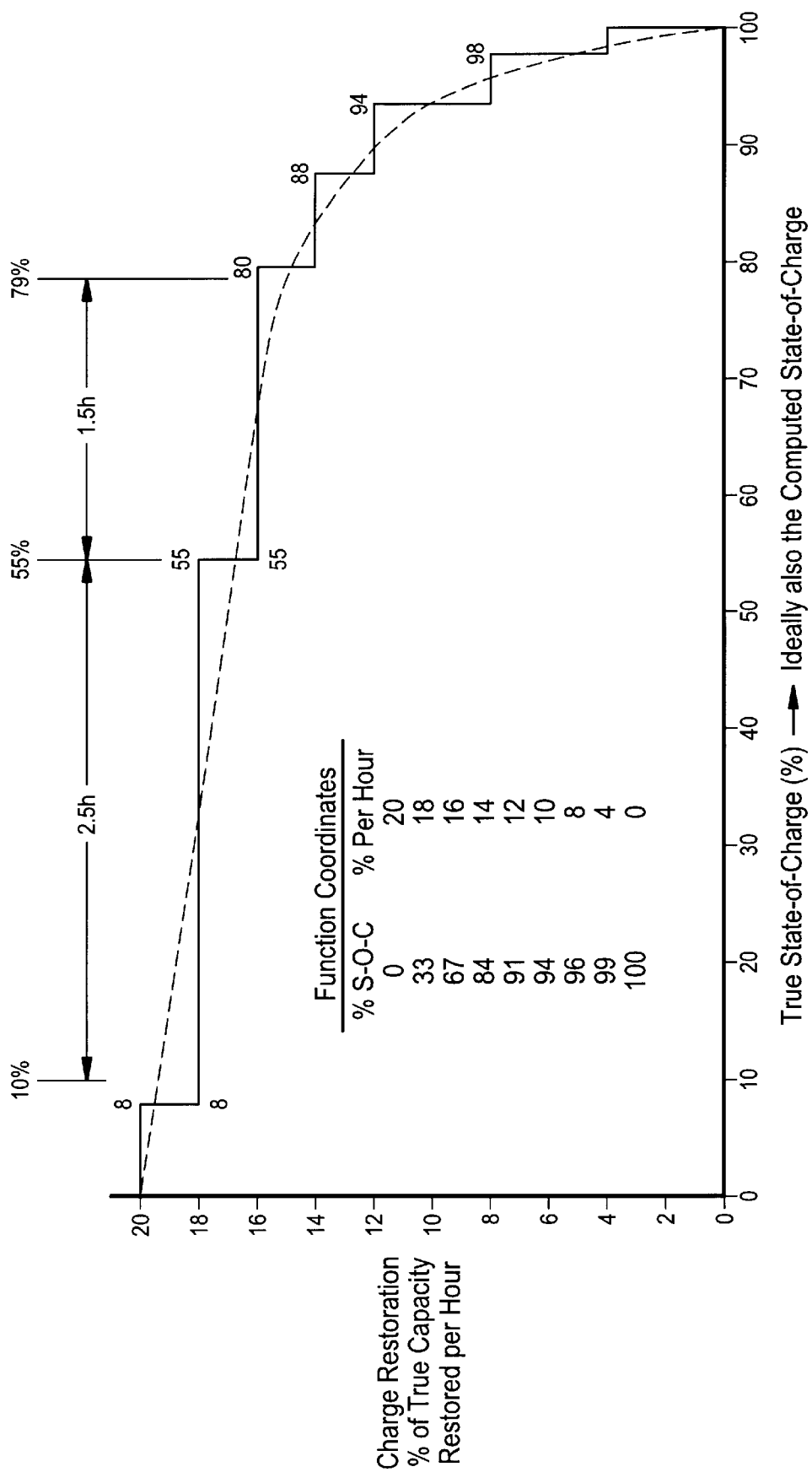
FIG. 5 is a graph of percent of true capacity restored per hour as a function of true state-of-charge, with the data divided into bands or ranges.

An alternative transform based on rate of restoration may, at times, be more efficient and may allow a smaller look-up table, but requires multiplication and addition operations. The alternative transform may also be expressed by equations. Such an alternative transform is shown on FIG. 5 in terms of true capacity restored per hour versus true state-of-charge, the latter ideally being also the computed state-of-charge. To minimize computation, a set of broad zones, or bands, is created that defines the rates of restoration. For example, 2.5 hours at 18 percent per hour plus 1.5 hours at 16 percent per hour would increment the state-of-charge computation in the battery monitor from 10 percent to 79 percent [10+(2.5×18)+(1.5×16)]=79, starting from an initial computed 10 percent state-of-charge.

The next level of refinement entails estimation of partial use of the disconnect time for opportunity charging; e.g., disconnect time may have been four hours, but charging occurred only over two hours. These estimation techniques can always be enhanced through knowledge of the specific application. Issues such as time-of-day equipment availability, maintenance schedules, operating rules, etc., can assist the estimation process by reducing the number of possibilities. For example, the estimation algorithm can be altered as a function of the typical operation cycle. Known patterns of use can reduce indeterminacy in the estimation process.

A time-of-day clock (and the date) can be very useful where only certain activities occur at certain times of the day and certain days of the week where certain events such as nighttime, lunchtime, scheduled breaks, and weekends, for example, are known. Some simple organizational instructions to the operating personnel can be developed, such as: if charge is needed at end of the workday, put the battery on an eight-hour charge cycle. Then, the task of the monitoring instrument the next morning is simply to ascertain if charging occurred during the night. If so, then the monitoring instrument is set to "full". If not, then the state-of-charge computation in the battery monitor is not changed.

A very powerful piece of information is an answer to the question: even if charging has occurred only over a portion of the disconnect time, has it been over at least some of the most recent time! The answer helps to decrease the indeterminacy following long power disconnects. If the long-term power disconnect can be classified as one of three possibilities: near term charging, past charging, or no charging, the indeterminacy can be reduced considerably. Shortly after charge terminations, the change in voltage with respect to time, or dV/dt, is very high and it is possible to detect this change in several seconds to assist in near-term charge verification and, in fact, dV/dt can be used as a "time since charging stopped" estimator.

The problem of determining the amount of charge restored when only a portion of the disconnect time is used for charging is the most difficult estimation. It is the intention of the present invention to use as much information as possible to reach a first estimate. This estimate could include a weighting (or averaging) of several estimates. For example, assume a 20 percent state-of-charge at time of disconnect and verification that some charging has occurred during the disconnect period. The estimation could proceed as follows:

(1) The disconnect time was four hours and the charge restoration is 60 percent to bring the state-of-charge computation to 80 percent, assuming a full-time charge during the disconnect period. This establishes an upper bound. Anything higher than this is impossible.

(2) The dV/dt is fairly low, indicating that the battery has probably been off charge at least one hour. This indicates a maximum charge period of three hours, reducing the charge restoration to 45 percent, bringing the computed state-of-charge to a maximum of 65 percent.

(3) Examination of a thermal analysis indicates that the battery has probably been charging about one-half the disconnect time which could have restored 30 percent for a computed state-of-charge of 50 percent.

(4) Examination of the absolute voltage, assuming one hour since charge, yields an estimate of 60 percent state-of-charge.

(5) Simple averaging produces an estimate of 65+50+60/3=58.3 state-of-charge. The values can also be weighted depending on experience with the particular battery/charger combination.

The concept of an upper bound of possibility is very important and prevents anomalies in voltage, voltage derivatives, thermal, thermal derivatives, etc. from providing an overly optimistic estimate of state-of-charge. All things considered, it is usually better for charge restoration estimates to err on the low side. In any case, periodic equalization charges are invariably necessary to balance all cells in a string and the battery state-of-charge computer will be re-synchronized at that time.

When the disconnect interval is very long and the derivative, dV/dt, is very low (probably lower than is practically measurable), the state-of-charge can be estimated solely by the open circuit voltage (with temperature compensation, if necessary, for wide temperature range applications). For example, if the interruption timer indicates 20 hours, the voltage derivative is immeasurably low, and the thermal analysis (if used) indicates there has been no charging activity for a very long time, it is assured that the voltage reading upon reconnection is quite meaningful, regardless of how much charging (if any) has taken place. Even if the battery had been empty at the time of disconnection, it would have had to be put on charge shortly after disconnection and it could have been allowed to proceed in charging for any length of time, for example, 0 to 8 to 10 hours, and the charging would have restored anywhere from 0 to 100 percent of the battery's capacity. Subsequently, it would have had at least 10 to 12 hours to stabilize and the voltage interpretation of state-of-charge will be accurate to several percentage points.

The next level of refinement returns to the problem of establishing a threshold of voltage upon reconnection to accurately answer the question: has charging taken place? This aspect of the present invention, the threshold voltage at the time of reconnection is corrected for the anticipated change of open circuit voltage over the measured interruption interval. It also allows for the possibility (although unlikely) that a charge had been interrupted.

Figure 6:
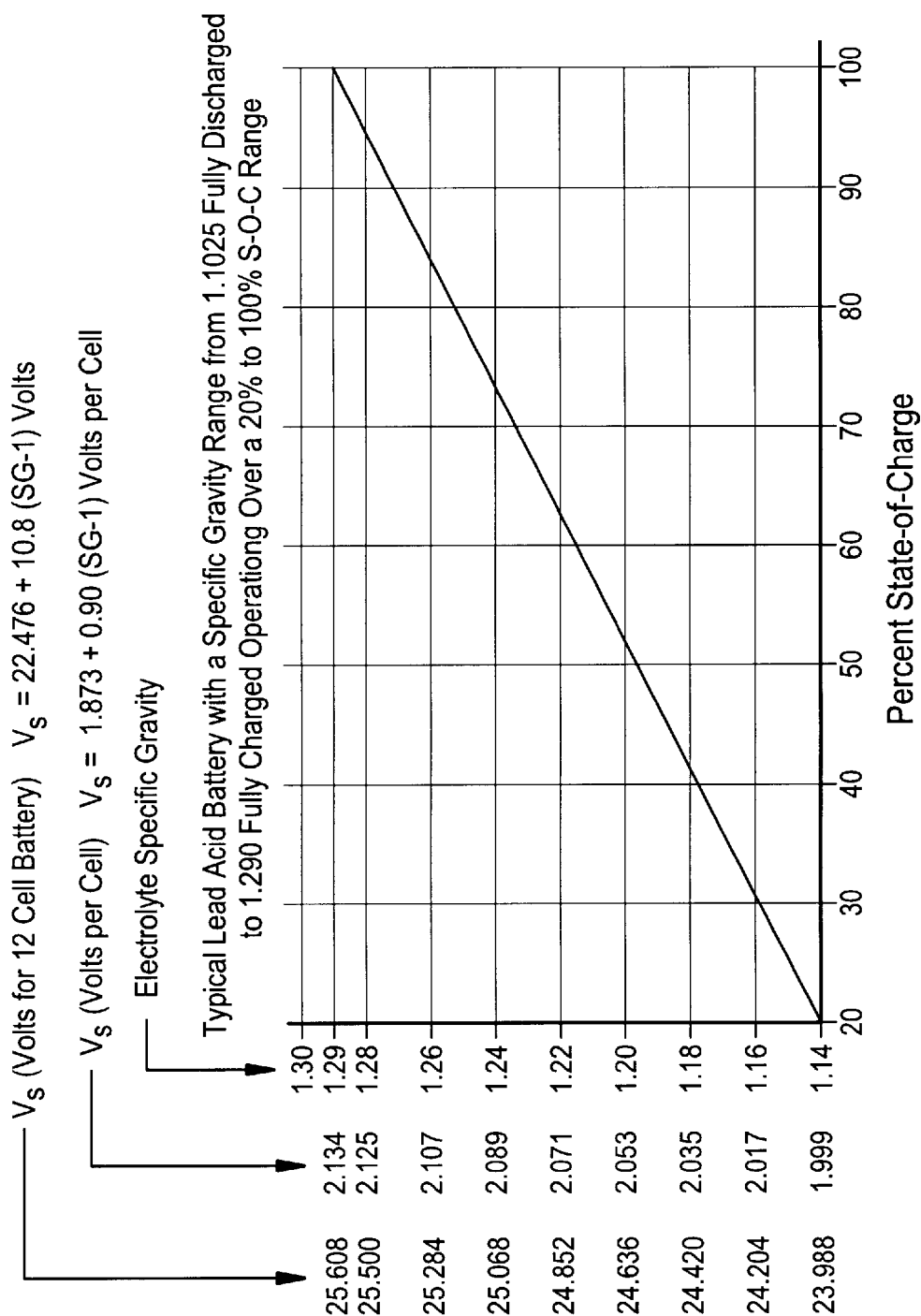
FIG. 6 is a graph of voltage and electrolyte specific gravity versus percent state-of-charge for an exemplary battery.
Figure 7:
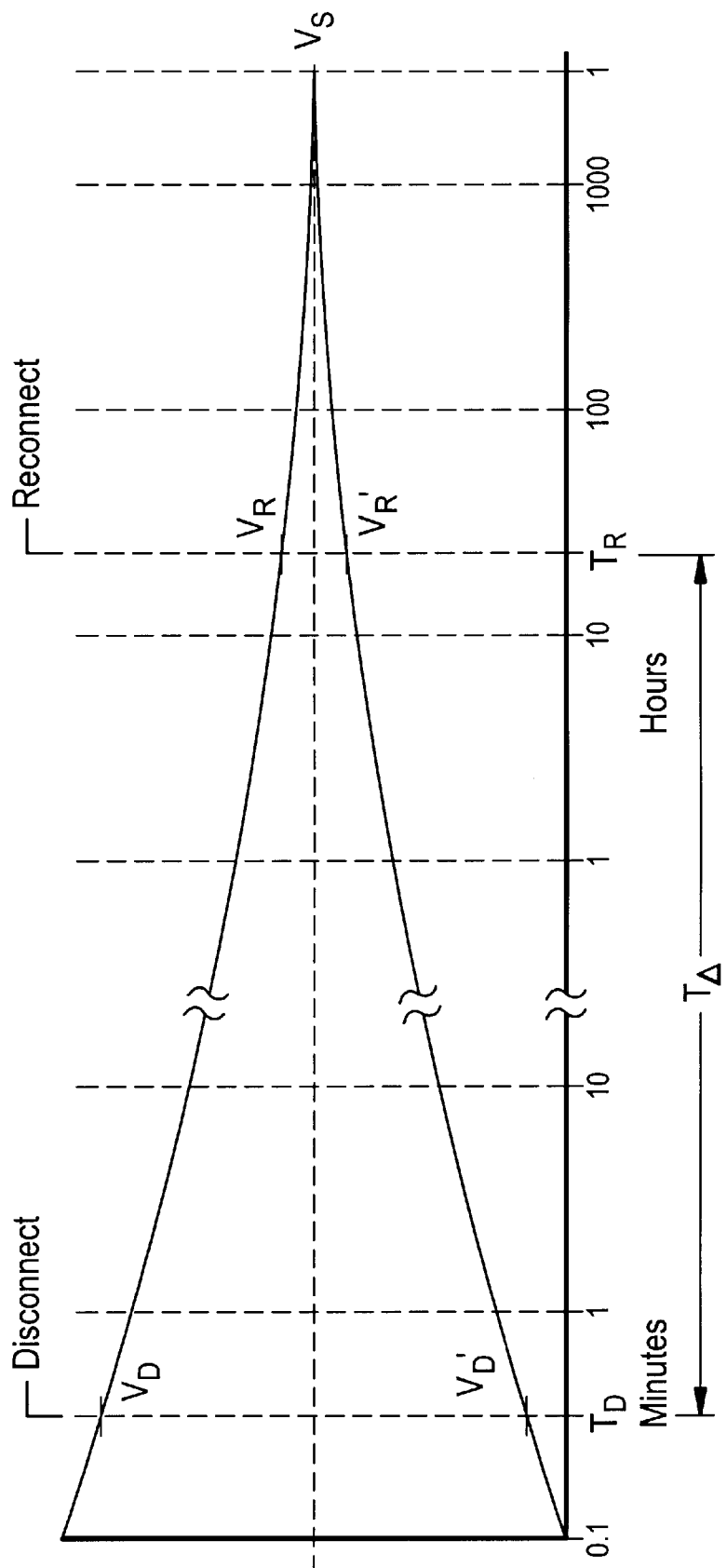
FIG. 7 is a graph of voltage versus disconnect time for the battery of FIG. 6, with the stabilized voltage of the battery indicated.

In all likelihood, the open circuit voltage at the time of disconnect is still recovering from a discharge, but it may have been an interrupted charge. This method keys on the fact that, for any state-of-charge, there will eventually be a reasonably accurate stabilized open circuit voltage. FIG. 6 illustrates data for a typical traction battery over the usual operational state-of-charge range of 20 to 100 percent. FIG. 7 illustrates the recovery characteristic for the battery in terms of voltage versus time, where VD is the open circuit voltage of a battery which is descending from a previous charge at the moment of battery monitor disconnection. This is addressing the case where the battery had been charged, was disconnected from the charger, reconnected to the vehicle and battery monitor, not used, and was disconnected from the vehicle at the moment of VD measurement. VD' is the more usual case of recording the voltage at the time of disconnection from the vehicle (and battery monitor) when the battery is recovering from discharge activity. VS is the voltage at which the battery will reasonably stabilize at after, say, hundreds of hours.

The determination as to whether any charging had taken place can be based upon four components: (1) the computed state-of-charge at time of disconnect, (2) the open circuit voltage at the time of disconnect, (3) the anticipated recovery of the open circuit voltage, and (4) the open circuit voltage at the time of reconnect. The determination is made as follows:

(1) Record voltage (VD or VD') at time of disconnect.

(2) Record computed state-of-charge (SD) at time of disconnect.

(3) Record real time at time of disconnect.

(4) Record voltage (VR or VR') at time of reconnect.

(5) Record real time at time of reconnect.

(6) Compute VS based upon SD (from FIG. 6).

(7) Compute disconnect time (TR−TD).

(8) Determine last charge or discharge. Was VD higher than VS or was VD' lower than VS?

(9) VD−VS or VS−VD' estimates position on the recovery characteristic of FIG. 7.

(10) Compute anticipated VR or VR'.

(11) Is actual VR or VR' higher than anticipated VR or VR'?

(12) If no, then charging did not take place. Leave computed state-of-charge undisturbed.

(13) If yes, then charging did take place and the question becomes whether the charging took place near term or some time ago. Two methods of answering this question are dV/dt analysis and temperature differential analysis, both discussed below.

The final level of refinement introduces a method for fast convergence to "fine tune" the state-of-charge restoration for those conditions where the charge restored computation has a wide latitude or contradictory inputs. For example, reference is made to the situation described above in which the various examinations produced conclusions of state-of-charge ranging from 50 percent to 65 percent, with an average of 58.3 percent. The fast convergence technique according to the present invention includes a battery monitor, of the type described in the above-referenced U.S. Pat. Nos. 4,560,937 and 5,451,881, running at a high rate, say, one to five minutes open loop. The state-of-charge monitor is pre-positioned at 58.3 percent, per the above example. Over the first several minutes of vehicular activity, the state-of-charge monitor is permitted to rise to as high as 65 percent, the maximum determined by the examinations, or descend to as low as 50 percent, the lowest determined by the examinations, if the 58.3 percent estimate is clearly running contrary to the actual loaded performance of the battery. Typically, the operator of the vehicle in which the battery is located would receive a warning, such as a light, that the state-of-charge indication is undergoing an updating computation. After the re-alignment interval, the light will extinguish and the battery state-of-charge computation will return to normal.

In the foregoing discussion, two methods have been noted of determining whether charging has occurred recently during a disconnect interval: (1) using a dV/dt analysis and (2) using a thermal analysis.

Figure 8:
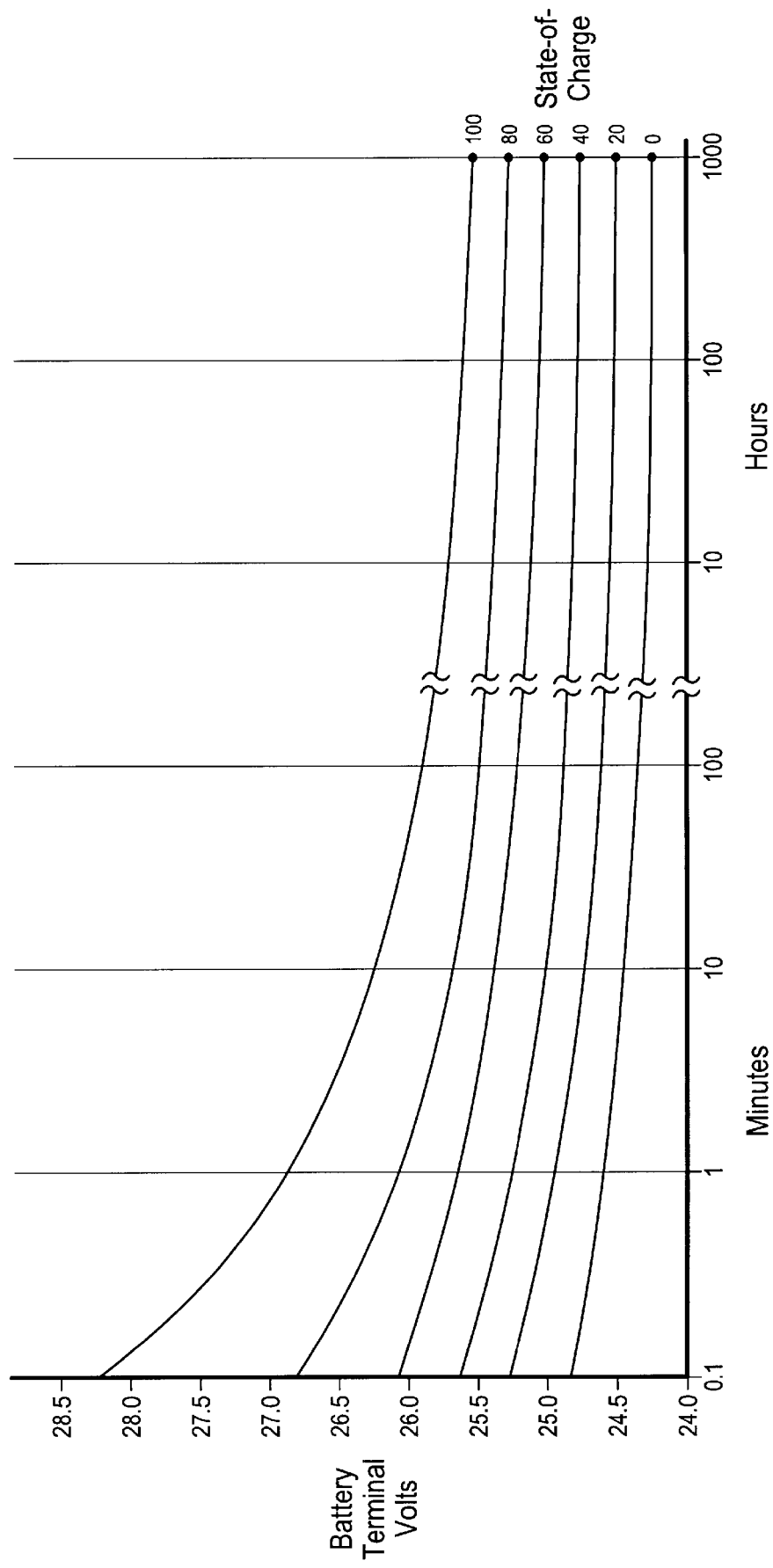
FIG. 8 is a graph of battery terminal voltage versus time as a function of battery state-of-charge for a typical battery.

The dV/dt analysis is based on techniques described in the above-referenced U.S. Pat. Nos. 4,460,870 and 4,514,694 which, inter alia, describe the open circuit voltage of batteries in time periods after charging and discharging. Of interest here is the change in voltage after charging has occurred. FIG. 8 illustrates battery terminal voltage versus time for various states-of-charge for a typical traction battery. It will be noted that in the interval of time shortly after charging has ceased, there is a rapid drop in terminal voltage, particularly if the battery is at a relatively high state-of-charge, the condition that likely would prevail if charging had occurred. After long periods of time, dV/dt is very low or immeasurable. Therefore, a value of dV/dt that is high indicates that charging of the battery was recent. Conversely, a low or immeasurable value of dV/dt indicates that the charging of the battery took place some time before reconnection, if at all. Using such curves for a particular battery, measuring dV/dt, and estimating the state-of-charge of the battery, the time off charge can be computed.

Figure 9:
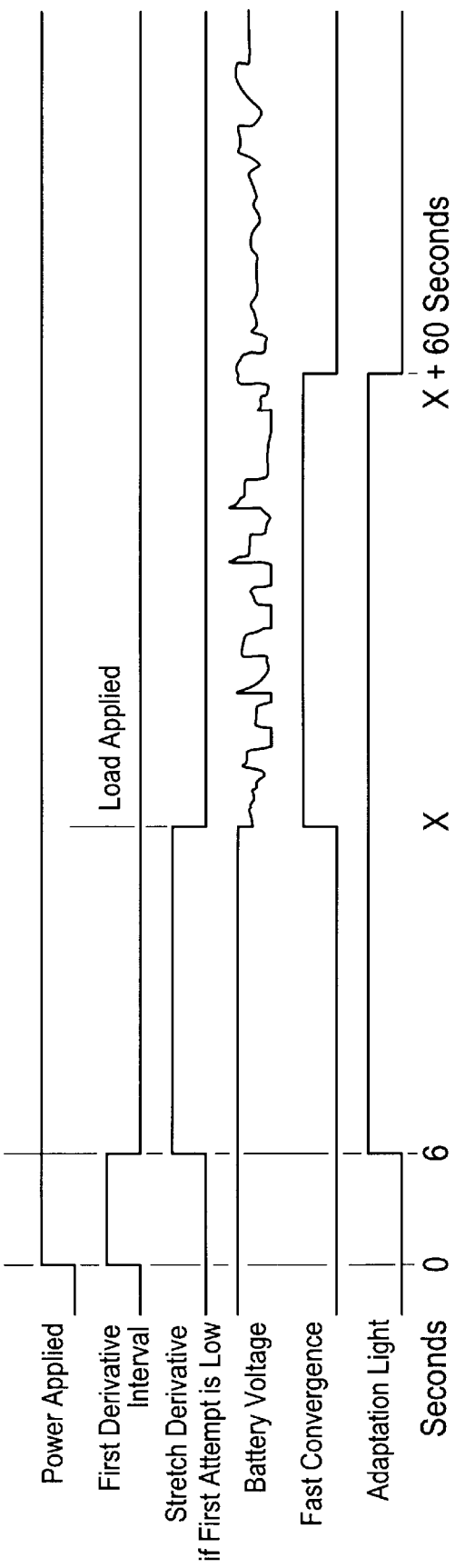
FIG. 9 comprises a set of waveforms showing progression from a stretched derivative mode to a fast convergence mode for a typical battery.

When the derivative is low, the dV/dt measurement can be automatically extended until a sudden drop in voltage occurs, signalling the application of a load. A light indicating that adaptation is taking place can be illuminated during this interval. This could be the same light which shows that the unit is updating the state-of-charge computation during the period of fast convergence. In fact, the unit may progress from the stretched derivative mode to the fast convergence mode, as shown on FIG. 9. There, the stretched derivative computation is stopped when the battery voltage suddenly drops, and the fast convergence interval is opened for one minute in this example. The stretched derivative is initiated when the six-second first derivative calculation is too low for accurate estimation of time off charge.

As indicated above, the dV/dt measurement is made after reconnection to determine how fast the battery voltage may be falling. It could take seconds to days for the reconnection to take place. A power connector is generally used which permits quick plugging and unplugging, and can often be done as quickly as an appliance or telephone connect/disconnect.

A short scenario is illustrated below:

| | |
|---|---|
| (1) Load disconnected | 1 sec. |
| (2) Charger connected | 1 sec. |
| (3) Charger turned on manually | 1 sec. |
| (4) Charger turned off after | 15 mins. |
| (5) Charger disconnected | 1 sec. |
| (6) Load reconnected | 1 sec. |

Time of battery monitor disconnection: 15 mins. 5 secs.
Total battery decay time: 2 secs.

A long scenario is illustrated below:

| | |
|---|---|
| (1) Load disconnected | 1 sec. |
| (2) Charger connected | 1 sec. |
| (3) Charger turned on manually | 1 sec. |
| (4) Charger turns off automatically | 8 hrs. |
| (5) Connector remains attached | 6 days |
| (6) Charger disconnected | 1 sec. |
| (7) Load reconnected | 1 sec. |

Time of battery monitor disconnection: 152 hrs., 5 secs.
Total battery decay time: 144 hrs., 2 secs.

Thermal analysis requires that temperature sensors with a differential temperature measurement be included in the system. The battery temperature sensor need not be electrically or mechanically attached to the battery, but could be, for example, embedded in an elastomeric material for electrical isolation and thermal isolation from the vehicle structure. A post or strap attached to the battery temperature sensor and compressed against the battery would provide good thermal conduction from the battery to the battery temperature sensor. A second sensor would be positioned to provide ambient or vehicular structure reference. The difference in temperatures can be used as a rough measure of when in a long time disconnect charging could have taken place, with a high difference indicating recent charging activity and a low difference indicating charging activity at some past time in the long time disconnect or no charging at all. The temperature differential can be stored in non-volatile memory (or recorded) when the power disconnect is detected. Upon reconnection, the differential is again measured (or recorded). Knowledge of the thermal time constants of the vehicle structure and the battery, coupled with knowledge of the self heating of the battery during charging enables a determination of near term charging versus past charging (or no charging) during long power disconnects.

Figure 10:
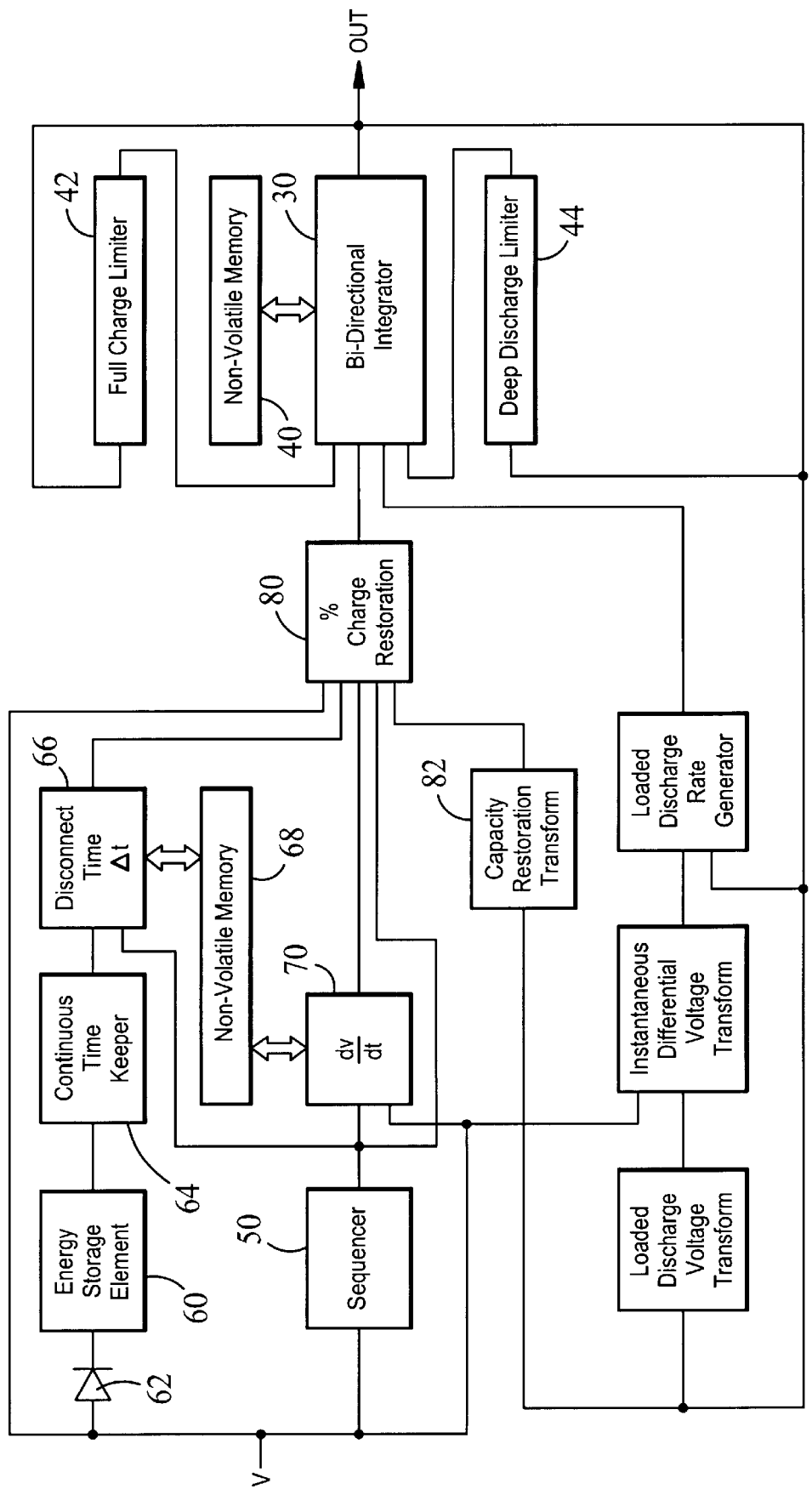
FIG. 10 is a block diagram of an apparatus according to the present invention.

FIG. 10 illustrates a monitoring system constructed according to the present invention, the system being indicated generally by the reference numeral 20. System 20 is connected at the left side of FIG. 10 to a battery (not shown), the condition of which is to be monitored, and provides an output at the right side of FIG. 10, the output indicating the condition of the battery.

System 20 includes a bi-directional integrator 30 which may be one of the instruments described in U.S. Pat. Nos. 4,193,026, 4,017,724, 4,560,937, or 5,451,881. Bi-directional integrator 30 has associated therewith a non-volatile memory 40, a full charge limiter 42, and a deep discharge limiter 44. The latter two elements are provided so that bi-directional integrator 30 cannot be driven above indicating "full charge" or below indicating "empty" of the battery.

A start-up sequencer 50 connected to the battery provides information on the order of operations upon start-up of system 20. An energy storage element 60, which may be a capacitor or one of the other elements noted above, is connected through a protective diode 62 to the battery and provides power to a continuous timekeeper 64 that provides an input to disconnect time calculation circuitry 66 that calculates the actual time of disconnection of the battery and stores that information in non-volatile memory 68. Circuitry 70 calculating dV/dt, which provides an estimate of the portion of the disconnect time that has been used for charging, also stores that information in non-volatile memory 68.

Percent charge restoration circuitry 80, which receives inputs of absolute voltage, time of disconnection, and dV/dt and which is also connected to receive an input from capacity restoration transform circuitry 82 drives bi-directional integrator 30 up scale. Capacity restoration transform circuitry 82 provides the calculated charge restored during the estimated charge time as a function of the initial state-of-charge. A loaded discharge rate generator 90 is connected to drive bi-directional integrator 30 down scale and receives an input from instantaneous differential voltage transform circuitry 92 which provides a signal to the loaded discharge rate generator which is a function of degree below a voltage threshold. Loaded discharge voltage transform circuitry 100 connected to instantaneous differential voltage transform circuitry 92 creates a feedback signal from bi-directional integrator 30 to establish voltage thresholds.

In the embodiments of the present invention described above, it will be recognized that individual elements and/or features thereof are not necessarily limited to a particular embodiment but, where applicable, are interchangeable and can be used in any selected embodiment even though such may not be specifically shown.

Terms such as "upper", "lower", "inner", "outer", "inwardly", "outwardly", and the like, when used herein, refer to the positions of the respective elements shown on the accompanying drawing figures and the present invention is not necessarily limited to such positions.

It will thus be seen that the objects set forth above, among those elucidated in, or made apparent from, the preceding description, are efficiently attained and, since certain changes may be made in the above construction without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described and all statements of the scope of the invention which, as a matter of language, might be said to fall therebetween.

I claim:

1. A method of condition monitoring of an opportunity charged battery, comprising:
    (a) determining length of time said battery has been off-line;
    (b) determining whether charging of said battery has occurred during said length of time;
    (c) if step (b) results in a determination that said charging of said battery has occurred, determining degree of charging of said battery occurring during said length of time; and
    (d) if step (b) results in a determination that charging of said battery has occurred, resetting a condition monitor associated with said battery to reflect said degree of charging of said battery.

2. A method of condition monitoring of an opportunity charged battery, as defined in claim 1, wherein:
    step (b) includes measuring terminal voltage of said battery at time of putting said battery on-line and comparing said terminal voltage of said battery at time of putting said battery on-line with a predetermined value which indicates that charging has occurred during said length of time.

3. A method of condition monitoring of an opportunity charged battery, as defined in claim 1, wherein:
    step (b) includes:
        (e) computing a state-of-charge of said battery at time of putting said battery off-line and determining an expected voltage threshold at time of putting said battery on-line from said computed state-of-charge;
        (f) measuring actual voltage threshold upon putting said battery on-line; and
        (g) comparing said expected voltage threshold with said actual voltage threshold.

4. A method of condition monitoring of an opportunity charged battery, as defined in claim 1, wherein:
    steps (b) and (c) include:
        (e) combining data representing charging current versus time and coulombic efficiency versus time for said battery to produce a transform of true state-of-charge versus time;
        (f) computing state-of-charge at time said battery is taken off-line;
        (g) using said state-of-charge at time said battery is taken off-line to extract a first value of time from said transform;
        (h) adding said first value of time and said length of time to produce a second value of time; and
        (i) using said second value of time to extract a value from said transform representing said degree of charging of said battery.

5. A method of condition monitoring of an opportunity charged battery, as defined in claim 1, wherein:
    steps (b) and (c) include:
        (e) computing a state-of-charge of said battery based upon a measurement of dV/dt at time of putting said battery on-line;
        (f) computing a state-of-charge of said battery based upon a thermal analysis of said battery at said time of putting said battery on-line;
        (g) computing a state-of-charge based on absolute battery voltage at time of putting said battery on-line; and
        (h) averaging values obtained in steps (e), (f), and (g) to obtain an estimate of true state-of-charge and said degree of charging of said battery.

6. A method of condition monitoring of an opportunity charged battery, as defined in claim 5, wherein:
    said true state-of-charge is not permitted to exceed an upper bound.

7. A method of condition monitoring of an opportunity charged battery, as defined in claim 5, wherein:
    said true state-of-charge is not permitted to descend below a lower bound.

8. A method of condition monitoring of an opportunity charged battery, as defined in claim 1, wherein:
    steps (b) and (c) include:
        (e) computing VD versus time, where VD is open circuit voltage of said battery which is descending from a previous charge at time of taking said battery off-line, where said battery had been charged, was disconnected from a charger, reconnected to a load and battery monitor, not used, and was taken off-line at the moment of VD measurement;

(f) computing VD' versus time, where VD' is terminal voltage at time of taking said battery off-line when said battery is recovering from discharge activity;
(g) computing VS, where VS is voltage at which said battery will reasonably stabilize over a long period of time;
(h) recording voltage (VD or VD') at time of taking said battery off-line;
(i) recording computed state-of-charge (SD) at time of taking said battery off-line;
(j) recording real time at time of taking said battery off-line;
(k) recording voltage (VR or VR') at time of putting said battery on-line;
(l) recording real time at time of putting said battery on-line;
(m) computing VS based upon SD;
(n) computing said length of time;
(o) determining last charge or discharge by determining whether VD is higher than VS or VD' lower than VS;
(p) computing anticipated VR or VR';
(q) determining if actual VR or VR' is higher than anticipated VR or VR'; and
(r) if actual VR or VR' is higher than anticipated VR or VR', then determining whether charging took place near term or some time ago.

9. A method of condition monitoring of an opportunity charged battery, as defined in claim 8, wherein:
determining whether charging took place near term or some time ago is accomplished using dV/dt analysis.

10. A method of condition monitoring of an opportunity charged battery, as defined in claim 8, wherein:
determining whether charging took place near term or some time ago is accomplished using differential thermal analysis.

11. A method of condition monitoring of an opportunity charged battery, as defined in claim 1, wherein:
step (d) includes running said condition monitor at a high rate during an adaptation, process.

12. A method of condition monitoring of an opportunity charged battery, as defined in claim 1, wherein:
step (b) includes measuring specific gravity of electrolyte of said battery at time of putting said battery on-line and comparing said specific gravity of electrolyte of said battery at time of putting said battery on-line with a predetermined value which indicates that charging has occurred during said length of time.

13. A method of condition monitoring of an opportunity charged battery, as defined in claim 1, wherein:
step (b) includes:
(e) computing a state-of-charge of said battery at time of putting said battery off-line and determining an expected specific gravity of electrolyte of said battery at time of putting said battery on-line from said computed state-of-charge;
(f) measuring actual specific gravity of electrolyte of said battery upon putting said battery on-line; and
(g) comparing said specific gravity of electrolyte of said battery with said actual specific gravity of electrolyte of said battery.

14. An apparatus for monitoring condition of an opportunity charged battery, comprising:
(a) means to determine length of time said battery has been off-line;
(b) means, connected to means of element (a), to determine whether charging of said battery has occurred during said length of time;
(c) means, connected to means of element (b), to determine if step (b) results in a determination that said charging of said battery has occurred and, if so, to determine degree of charging of said battery occurring during said length of time; and
(d) means, connected to means of element (b), to determine if step (b) results in a determination that charging of said battery has occurred and, if so, to reset a condition monitor associated with said battery to reflect said degree of charging of said battery.

* * * * *